United States Patent
Dechoux et al.

(10) Patent No.: US 10,026,870 B2
(45) Date of Patent: Jul. 17, 2018

(54) OPTOELECTRONIC DEVICE HAVING SEMICONDUCTOR ELEMENTS

(71) Applicant: Aledia, Grenoble (FR)

(72) Inventors: Nathalie Dechoux, Fontanil Cornillon (FR); Thomas Lacave, Grenoble (FR); Benoît Amstatt, Grenoble (FR); Philippe Gibert, Saint-Etienne-de-Crossey (FR)

(73) Assignee: Aledia, Grenoble (FR)

( * ) Notice: Subject to any disclaimer, the term of this patent is extended or adjusted under 35 U.S.C. 154(b) by 0 days.

(21) Appl. No.: 15/323,174

(22) PCT Filed: Jun. 22, 2015

(86) PCT No.: PCT/EP2015/063895
§ 371 (c)(1),
(2) Date: Dec. 30, 2016

(87) PCT Pub. No.: WO2016/000990
PCT Pub. Date: Jan. 7, 2016

(65) Prior Publication Data
US 2017/0148950 A1    May 25, 2017

(30) Foreign Application Priority Data

Jul. 2, 2014 (FR) .................................. 14 56317

(51) Int. Cl.
*H01L 33/18* (2010.01)
*H01L 33/00* (2010.01)
(Continued)

(52) U.S. Cl.
CPC ........ *H01L 33/18* (2013.01); *H01L 31/03048* (2013.01); *H01L 31/035227* (2013.01);
(Continued)

(58) Field of Classification Search
CPC ....... H01L 33/18; H01L 33/007; H01L 33/32; H01L 31/03048; H01L 31/035227; H01L 31/1856; H01L 29/0676; Y10S 977/762
See application file for complete search history.

(56) References Cited

U.S. PATENT DOCUMENTS 7,081,383 B2 *   7/2006   Gutsche ............. H01L 27/1087
                                                        257/E21.019
7,368,395 B2 *   5/2008   Islam .................. H01L 21/0337
                                                        257/E21.305
(Continued)

FOREIGN PATENT DOCUMENTS

EP    2 254 164 A1    11/2010
EP    2 333 847 A1    6/2011
(Continued)

OTHER PUBLICATIONS

International Search Report for Application No. PCT/EP2015/063895, dated Aug. 28, 2015.
(Continued)

*Primary Examiner* — Ida M Soward
(74) *Attorney, Agent, or Firm* — Wolf, Greenfield & Sacks, P.C.

(57) ABSTRACT

An optoelectronic device including a substrate having a surface, openings which extend in the substrate from the surface, and semiconductor elements, each semiconductor element partially extending into one of the openings and partially outside said opening, the height of each opening being at least 25 nm and at most 5 μm and the ratio of the height to the smallest diameter of each opening being at least 0.5 and at most 15.

7 Claims, 6 Drawing Sheets

(51) Int. Cl.
*H01L 33/32* (2010.01)
*H01L 31/18* (2006.01)
*H01L 29/06* (2006.01)
*H01L 31/0304* (2006.01)
*H01L 31/0352* (2006.01)

(52) U.S. Cl.
CPC ........ *H01L 31/1856* (2013.01); *H01L 33/007* (2013.01); *H01L 33/32* (2013.01); *H01L 29/0676* (2013.01); *Y10S 977/762* (2013.01)

(56) References Cited

U.S. PATENT DOCUMENTS

| | | | | |
|---|---|---|---|---|
| 7,507,987 B2* | 3/2009 | Kim | ........................ | B82Y 10/00 257/10 |
| 7,700,419 B2* | 4/2010 | Anwar | .................... | B82Y 10/00 257/E21.179 |
| 7,910,915 B2* | 3/2011 | Kamins | .................. | B82Y 20/00 257/12 |
| 8,030,666 B2* | 10/2011 | Chen | ................. | H01L 21/02381 257/103 |
| 8,134,169 B2* | 3/2012 | Yu | ......................... | H01L 27/156 257/94 |
| 8,503,161 B1* | 8/2013 | Chang | ...................... | H01G 9/00 361/502 |
| 9,082,844 B2* | 7/2015 | Cho | ................... | H01L 21/02343 |
| 9,530,914 B2* | 12/2016 | Jeong | ............... | H01L 31/022425 |
| 2002/0117104 A1 | 8/2002 | Hata et al. | | |
| 2006/0063358 A1 | 3/2006 | Bedell et al. | | |
| 2008/0029909 A1* | 2/2008 | Hijzen | ................... | B82Y 10/00 257/784 |
| 2010/0276669 A1* | 11/2010 | Richter | ................. | B82Y 10/00 257/24 |
| 2011/0180783 A1* | 7/2011 | Gao | ........................ | B82Y 10/00 257/15 |
| 2014/0054599 A1* | 2/2014 | Choi | ................. | H01L 31/03044 257/76 |
| 2014/0242297 A1* | 8/2014 | Yau | ........................ | H05K 3/467 427/557 |
| 2015/0216682 A1* | 8/2015 | Achyuta | ................... | A61F 2/72 607/118 |

FOREIGN PATENT DOCUMENTS

FR 2 925 979 A1 7/2009
JP 2006-339534 A 12/2006

OTHER PUBLICATIONS

Li et al. GaN based nanorods for solid state lighting. Journal of Applied Physics. Apr. 2012. 111(7):71101-1-71101-23.
Written Opinion of the International Searching Authority for Application No. PCT/EP2015/063895 dated Jan. 3, 2017.

* cited by examiner

OPTOELECTRONIC DEVICE HAVING SEMICONDUCTOR ELEMENTS

CROSS-REFERENCE TO RELATED APPLICATIONS

This application is the national phase of International Application No. PCT/EP2015/063895, filed on Jun. 22, 2015, which claims priority to French Patent Application FR14/56317, filed on Jul. 2, 2014, which applications are incorporated herein by reference to the maximum extent allowable by law.

BACKGROUND

The present invention generally relates to optoelectronic devices based on semiconductor materials and to methods of manufacturing the same. The present invention more particularly relates to optoelectronic devices comprising micrometer-range or nanometer-range semiconductor elements, particularly semiconductor microwires, nanowires, or structures having a pyramidal shape.

DISCUSSION OF THE RELATED ART

Micrometer- or nanometer-range semiconductor elements, particularly microwires, nanowires, or structures of pyramidal shape comprising a semiconductor material, particularly mainly comprising at least one group-III element and one group-V element (for example, gallium nitride GaN), called III-V compound hereafter, enable to manufacture semiconductor devices such as optoelectronic devices. Term "optoelectronic devices" is used to designate devices capable of converting an electric signal into an electromagnetic radiation or the other way around, and especially devices dedicated to the detection, the measurement, or the emission of an electromagnetic radiation or devices dedicated to photovoltaic applications.

Methods of manufacturing micrometer- or nanometer-range semiconductor elements comprising a III-V compound should enable to manufacture such semiconductor elements with an accurate and uniform control of the geometry, of the position, and of the crystallographic properties of each semiconductor element.

The manufacturing of an optoelectronic device comprising micrometer- or nanometer-range semiconductor elements generally comprises forming seeds on a layer of a material favoring the forming of seeds of the III-V compound, called seed layer, the growth of the semiconductor elements from the seeds, and the forming of an active layer on each semiconductor element. To control the locations where the semiconductor element grow, the seed layer is for example covered with an insulating layer provided with openings exposing portions of the seed layer formed therein.

It is desirable to have a single seed forming on the seed layer in each opening. However, a plurality of seeds may form in a same opening. This may cause the growth of a plurality of semiconductor elements from a same opening. A poor control of the growth of such semiconductor element is then obtained, particularly as concerns the height and the orientation of each semiconductor element. This may result in a degradation of the operation of the optoelectronic device.

Further, mechanical stress may appear in the optoelectronic device during the growth of the semiconductor elements due to expansion differences between the insulating layer and the substrate. Such stress may disturb the proper operation of the optoelectronic device.

SUMMARY

An embodiment aims at overcoming all or part of the disadvantages of previously-described optoelectronic devices and of their manufacturing methods.

An embodiment enables to obtain the desired height and orientation for each semiconductor element of the optoelectronic device.

An embodiment enables to decrease, or even to suppress, the occurrence of mechanical stress in the substrate during the growth of the semiconductor elements.

Thus, an embodiment provides an optoelectronic device comprising a substrate comprising a surface, openings extending into the substrate from the surface and semiconductor elements, each semiconductor element extending partly in one of the openings and partly outside of the opening, the height of each opening being greater than or equal to 25 nm and smaller than or equal to 5 µm and the ratio of the height to the smallest diameter of each opening being greater than or equal to 0.5 and smaller than or equal to 15.

According to an embodiment, the semiconductor elements are nanowires, microwires, and/or nanometer- or micrometer-range pyramidal structures.

According to an embodiment, the height is greater than or equal to 100 nm.

According to an embodiment, the height is greater than or equal to 500 nm.

According to an embodiment, the average diameter of each opening is constant along the entire height of the opening.

According to an embodiment, the device comprises, at the bottom of each opening, a pad made of at least a first material selected from the group comprising aluminum nitride, boron, boron nitride, titanium, titanium nitride, tantalum, tantalum nitride, hafnium, hafnium nitride, niobium, niobium nitride, zirconium, zirconium borate, zirconium nitride, silicon carbide, tantalum carbide nitride, magnesium nitride in $Mg_xN_y$ form, where x is approximately equal to 3 and y is approximately equal to 2, or gallium nitride.

According to an embodiment, each semiconductor element mainly is a III-V compound, particularly gallium nitride, or a II-VI compound.

According to an embodiment, the substrate is made of a second material from the group comprising a semiconductor material, particularly silicon, germanium, silicon carbide, a III-V compound such as GaN or GaAs, or ZnO.

According to an embodiment, the device further comprises, for each semiconductor element, a shell comprising at least one active layer partly covering the semiconductor element, and capable of emitting or of absorbing a radiation.

An embodiment also provides a method of manufacturing an optoelectronic device, comprising the steps of:

forming in a substrate, comprising a surface, openings extending into the substrate from the surface, the height of each opening being greater than or equal to 25 nm and smaller than or equal to 5 µm and the ratio of the height to the average diameter of each opening at the top of the portion being greater than or equal to 0.5 and smaller than or equal to 15; and growing a semiconductor element successively partly in each opening and outside of each opening.

According to an embodiment, the height of each opening is greater than or equal to 100 nm.

According to an embodiment, the method comprises forming, at the bottom of each opening, a pad made of at least a first material selected from the group comprising aluminum nitride, boron, boron nitride, titanium, titanium nitride, tantalum, tantalum nitride, hafnium, hafnium nitride, niobium, niobium nitride, zirconium, zirconium borate, zirconium nitride, silicon carbide, tantalum carbide nitride, magnesium nitride in $Mg_xN_y$ form, where x is approximately equal to 3 and y is approximately equal to 2, or magnesium gallium nitride, tungsten, tungsten nitride, or a combination thereof.

According to an embodiment, the method comprises the steps of:
etching the openings into the substrate;
depositing a layer of the first material on the substrate, including in the openings; and
etching said layer to only leave said pads.

According to an embodiment, the method comprises the steps of:
depositing a resin layer on the surface;
etching the resin layer and the substrate to form the openings;
forming the pads of the first material and first portions of the first material on the resin layer; and
removing the resin layer and the first portions.

According to an embodiment, the method comprises the steps of:
(a) depositing an insulating layer on the surface;
(b) etching the insulating layer and the substrate to form the openings;
(c) forming, by an anisotropic deposition, the pads of the first material and second portions of the first material on the insulating layer; and
(d) removing the second portions and the insulating layer.

According to an embodiment, the method comprises, after step (b), a step of isotropic etching of the substrate, selective over the insulating layer.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
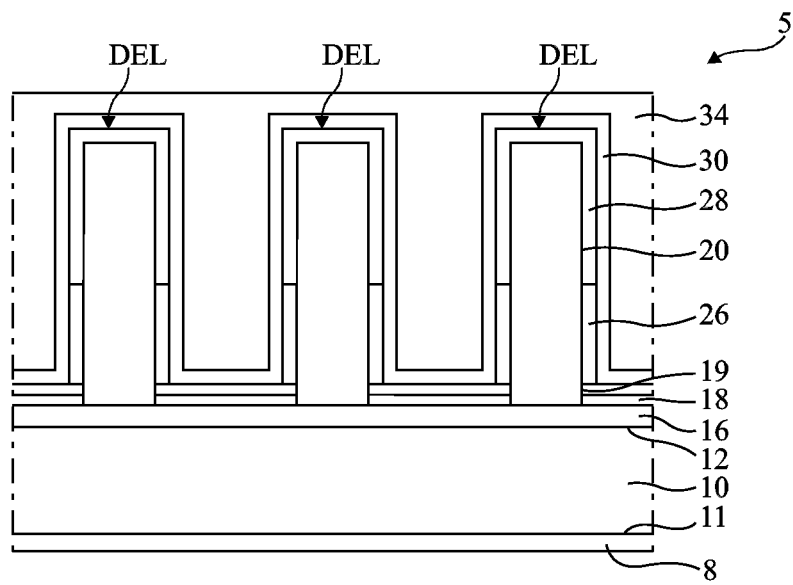
FIG. 1 is a partial simplified cross-section view of an example of an optoelectronic device comprising microwires or nanowires.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for biasing the optoelectronic device are well known and will not be described.

In the following description, unless otherwise indicated, terms "substantially", "approximately", and "in the order of" mean "to within 10%". Further, "compound mainly formed of a material" or "compound based on a material" means that a compound comprises a proportion greater than or equal to 95% of said material, this proportion being preferably greater than 99%.

In the following description, a method where a substantially constant thickness of material is deposited on all the exposed surfaces of a substrate is called conformal deposition method. Further, a method where a material is deposited on the exposed surfaces of the substrate which are perpendicular to a given direction but is not deposited on the exposed surfaces of the substrate which are parallel to the given direction is called directional deposition method. Further, a deposition method intermediate between a conformal deposition method and a directional deposition method where material is deposited on all the exposed surfaces of the substrate, the deposited thickness being however not constant and depending, in particular, on the orientation of the exposed surfaces of the substrate with respect to a given direction is called partially conformal deposition.

The present description relates to optoelectronic devices comprising semiconductor elements having the shape of microwires, of nanowires, or of pyramids.

Term "microwire" or "nanowire" designates a three-dimensional structure of elongated shape along a preferred direction, having at least two dimensions, called minor dimensions, in the range from 5 nm to 2.5 µm, preferably from 50 nm to 2.5 µm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 µm, preferably in the range from 100 nm to 1 µm, more preferably from 100 nm to 800 nm. In certain embodiments, the height of each microwire or nanowire may be greater than or equal to 500 nm, preferably in the range from 1 µm to 50 µm.

In the following description, term "wire" is used to mean "microwire or nanowire". Preferably, the median line of the wire which runs through the centers of gravity of the cross-sections, in planes perpendicular to the preferred direction of the wire, is substantially rectilinear and is called "axis" of the wire hereafter.

In the following description, term pyramid or truncated pyramid designates a three-dimensional structure having a pyramidal or elongated conical shape. The pyramidal structure may be truncated, that is, the top of the cone is absent and replaced with a flat area. The base of the pyramid is inscribed within a polygon having a side dimension from 100 nm to 10 µm, preferably from 1 to 3 µm. The polygon forming the base of the pyramid may be a hexagon. The height of the pyramid between the base of the pyramid and the apex or the top plateau varies from 100 nm to 20 µm, preferably from 1 µm to 10 µm.

In the following description, embodiments will be described in the case of an optoelectronic device comprising light-emitting diodes. It should however be clear that these embodiments may concern other applications, particularly devices dedicated to the detection or to the measurement of an electromagnetic radiation or devices dedicated to photovoltaic applications.

FIG. 1 is a partial simplified cross-section view of an example of an optoelectronic device 5 comprising light-emitting diodes. FIG. 1 shows a structure comprising, from bottom to top:

a first electrode 8;

a semiconductor substrate 10 comprising a lower surface 11 and an upper surface 12, lower surface 11 being covered with first electrode 8 and upper surface 12 being preferably planar at least at the level of the light-emitting diodes;

a seed layer 16 made of a conductive material favoring the growth of wires and arranged on surface 12;

an insulating layer 18 covering seed layer 12 and comprising openings 19 exposing portions of seed layer 16;

semiconductor elements 20 which, in the present embodiment, are wire-shaped (three wires being shown), each wire 20 being in contact with seed layer 16 through one of openings 19;

an insulating layer 26 extending on insulating layer 18 and on the lateral sides of a lower portion of each wire 20;

a shell 28 comprising a stack of semiconductor layers covering an upper portion of each wire 20;

a layer 30 forming a second electrode covering each shell 28 and further extending on insulating layer 26; and an encapsulation layer 34 covering the entire structure and particularly electrode 30.

The assembly formed by each wire 20 and the associated shell 28 forms a light-emitting diode DEL. Shell 28 comprises, in particular, an active layer, which is the layer from which most of the electromagnetic radiation delivered by light-emitting diode DEL is emitted. Light-emitting diodes DEL may be connected in parallel and form an assembly of light-emitting diodes. The assembly may comprise from a few light-emitting diodes DEL to a thousand light-emitting diodes.

Figure 2A:
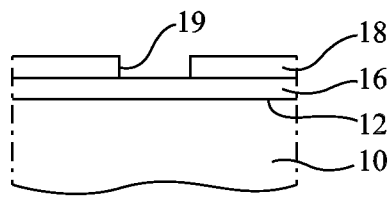
FIGS. 2A to 2C are partial simplified cross-section views of structures obtained at successive steps of a method of manufacturing the optoelectronic device shown in FIG. 1.
Figure 2B:
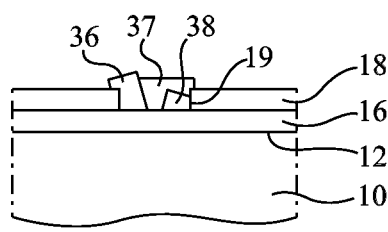
Figure 2C:
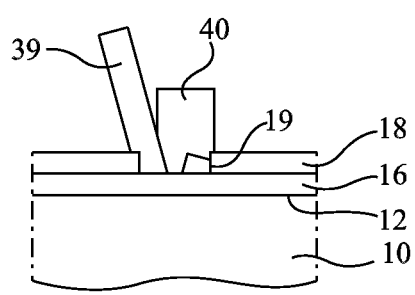

FIGS. 2A to 2C illustrate the initial steps of an example of a method of manufacturing optoelectronic device 5 shown in FIG. 1.

FIG. 2A shows the structure obtained after the steps of:

forming on surface 12 of substrate 10 seed layer 16, for example, by epitaxy;

forming insulating layer 18 on seed layer 16;

forming openings 19 in insulating layer 18, a single opening 19 being shown in FIGS. 2A to 2C.

Insulating layer 18 may be made of a dielectric material, for example, of silicon oxide ($SiO_2$). As an example, the thickness of insulating layer 18 is in the range from 5 nm to 2 µm, for example, equal to approximately 30 nm. The cross-section of each opening 19 substantially corresponds to the desired cross-section of wire 20. Preferably, the diameter of wire 20 is in the range from 100 nm to 1 µm, preferably from 300 nm to 800 nm.

FIG. 2B shows the structure obtained after the growth of seeds in openings 19, for example, by metal-organic chemical vapor deposition (MOCVD). The inventors have shown that a plurality of seeds may form in a same opening 19, three seeds 36, 37, 38 being shown as an example in FIG. 2B.

FIG. 2C shows the structure obtained after the growth of wires. As shown in the drawing, when several seeds 36, 37, 38 are initially present in a same opening 19, a plurality of wires 39, 40 may grow from opening 19 with different growth axes.

Figure 3:
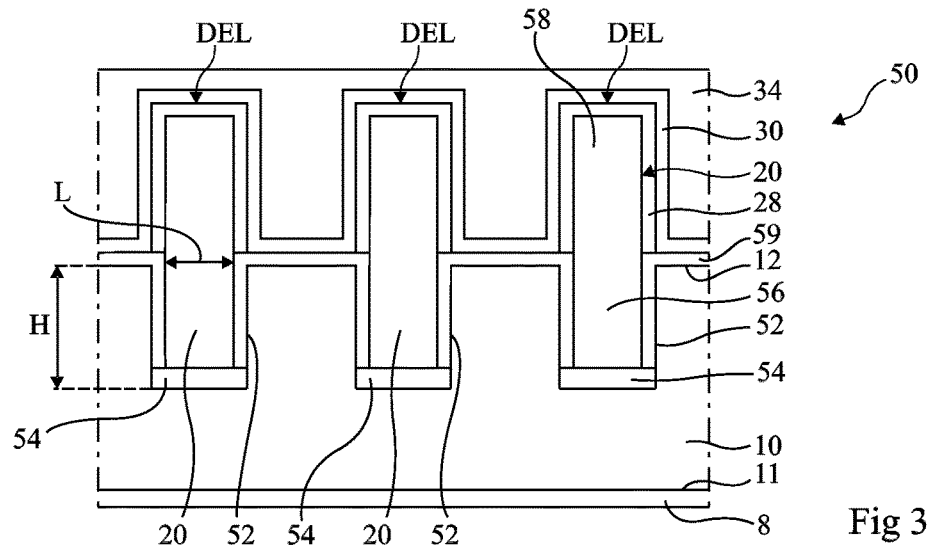
FIG. 3 is a partial simplified cross-section view of an embodiment of an optoelectronic device comprising microwires or nanowires.

FIG. 3 is a partial simplified cross-section view of an embodiment of an optoelectronic device 50 comprising light-emitting diodes, having its semiconductor elements corresponding to nanowires or microwires.

Optoelectronic device 50 comprises the same elements as optoelectronic device 5 shown in FIG. 1, with the difference that it comprises openings 52 formed in substrate 10, each of which have one of wires 20 growing inside of it. Openings 52 are non-through. Further, layer 18 is not present. Further, seed layer 16 is replaced with seed pads or islands 54, made of the same material as seed layer 16, seed pads 54 being located at the bottom of openings 52. Each wire 20 rests on one of seed pads 54. In the following description, term top of opening 52 designates the end of opening 52 most remote from seed pad 54 and term base of opening 52 designates the end of opening 52 having seed pad 54 resting thereon. Each wire 20 comprises a lower portion 56 in opening 52 and a wire-shaped upper portion 58 outside of opening 52. Optoelectronic device 50 may further comprise a passivation layer 59 which extends on surface 12 of substrate 10 and on the lateral walls, except for the bottom, of each opening 52.

Figure 4:
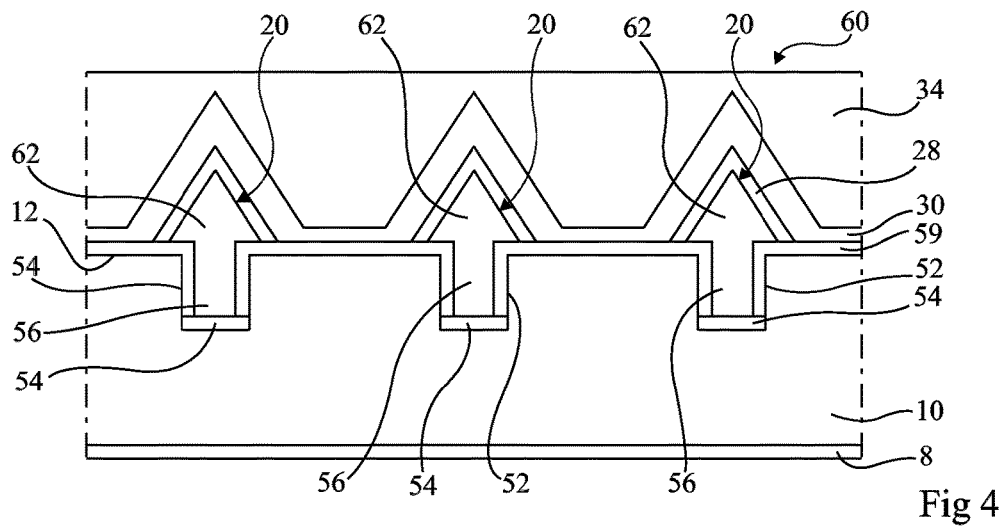
FIGS. 4 and 5 are partial simplified cross-section views of embodiments of optoelectronic devices respectively comprising pyramids and truncated pyramids.

FIG. 4 is a partial simplified cross-section view of another embodiment of an optoelectronic device 60 comprising light-emitting diodes. Optoelectronic device 60 comprises the same elements as optoelectronic device 50 shown in FIG. 3, with the difference that wire-shaped upper portion 58 is replaced with a pyramidal portion 62 outside of opening 52. The base of pyramid 62 may rest on substrate 10 and is wider than underlying opening 52.

Figure 5:
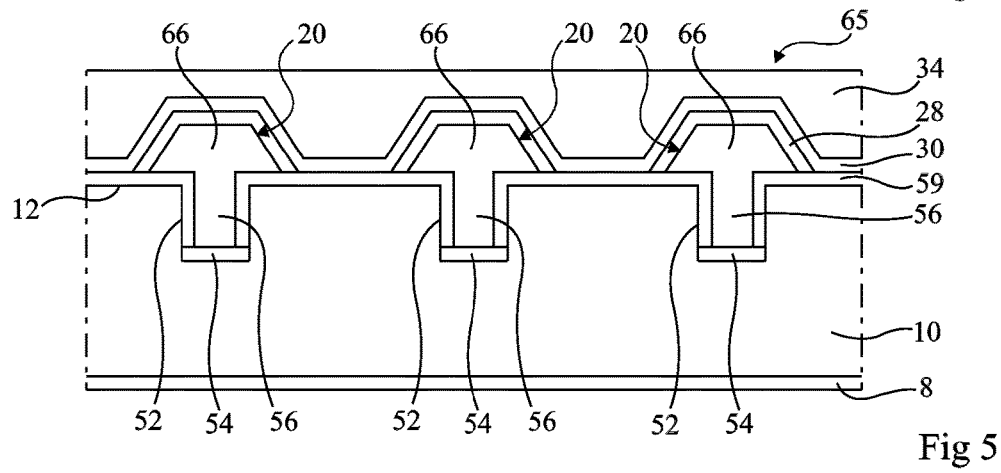

FIG. 5 is a partial simplified cross-section view of another embodiment of an optoelectronic device 65 comprising light-emitting diodes. Optoelectronic device 65 comprises the same elements as optoelectronic device 60 shown in FIG. 4, with the difference that each pyramid 62 is replaced with a truncated pyramid 66. In the following description, unless otherwise mentioned, term pyramid indifferently designates a whole pyramid 62 such as shown in FIG. 4 or a truncated pyramid 66 such as shown in FIG. 5.

In the case of wire-shaped semiconductor elements 20, the wire diameter is substantially the same as the corresponding diameter of opening 52. In the case of pyramids 62, 66, a widening of the semiconductor structure starting just at the exit of opening 52 can be observed.

The cross-section of openings 52 may have different shapes, such as, for example, a shape which may be oval, circular, or polygonal, particularly triangular, rectangular, square, or hexagonal. Term "diameter" or of "average diameter" in a cross-section of an opening or of a wire designates a quantity associated with the surface area of the targeted structure in this cross-section, for example corresponding to the diameter of the disk having the same surface area as the cross-section of the opening or of the wire. This same equivalent diameter principle may be applied to pyramidal structures, especially for the pyramid base.

Call H the height of opening 52 and L the diameter of opening 52. According to an embodiment, diameter L of opening 52 is substantially constant all along height H. As an example, height H of each opening 52 is in the range from 25 nm to 5 μm, preferably from 200 nm to 2,000 nm, more preferably from 300 nm to 1,000 nm. As an example, diameter L of each opening 52 is in the range from 10 nm to 2 μm, preferably from 100 nm to 600 nm. Ratio F of height H to diameter L is in the range from 0.5 to 15, preferably from 1 to 10.

The inventors have shown that when openings 52 have the previously-indicated dimensions H, L, and F, the growth of a single wire 20 per opening 52 can be observed.

Substrate 10 may correspond to a monoblock structure or correspond to a layer covering a support made of another material. Substrate 10 is preferably a semiconductor substrate, for example, a substrate made of silicon, of germanium, of silicon carbide, of a III-V compound such as GaN or GaAs, or a ZnO substrate. Preferably, substrate 10 is a single-crystal silicon substrate. Preferably, it is a semiconductor substrate compatible with manufacturing methods implemented in microelectronics. Substrate 10 may correspond to a multilayer structure of silicon-on-insulator type, also called SOI.

Substrate 10 may be heavily doped, lightly-doped or non-doped. In the case where the substrate is heavily doped, semiconductor substrate 10 may be doped to lower the electric resistivity down to a resistivity close to that of metals, preferably lower than a few mohm·cm. Substrate 10 for example is a heavily-doped substrate having a dopant concentration in the range from $5*10^{16}$ atoms/cm$^3$ to $2*10^{20}$ atoms/cm$^3$. In the case where the substrate is lightly-doped, for example, with a dopant concentration smaller than or equal to $5*10^{16}$ atoms/cm$^3$, preferably substantially equal to $10^{15}$ atoms/cm$^3$, a doped region of the first conductivity type or of a second conductivity type, opposite to the first type, more heavily-doped than the substrate may be provided, which extends into substrate 10 from surface 12. In the case of a silicon substrate 10, examples of P-type dopants are boron (B) or indium (In) and examples of N-type dopants are phosphorus (P), arsenic (As), or antimony (Sb). Surface 12 of silicon substrate 10 may be a (100) surface.

Seed pads 54 are made of a material favoring the growth of semiconductor elements 20. As an example, the material forming seed pads 54 may be a nitride, a carbide, or a boride of a transition metal from column IV, V, or VI of the periodic table of elements, or a combination of these compounds. As an example, seed layer 16 may be made of aluminum nitride (AlN), of aluminum oxide ($Al_2O_3$), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate ($ZrB_2$), of zirconium nitride (ZrN), of silicon carbide (SiC), of tantalum carbide nitride (TaCN), of magnesium nitride in $Mg_xN_y$ form, where x is approximately equal to 3 and y is approximately equal to 2, for example, magnesium nitride according to form $Mg_3N_2$. Seed pads 54 may be doped with the same conductivity type as substrate 10. Seed pads 54 for example have a thickness in the range from 1 to 100 nanometers, preferably in the range from 10 to 30 nanometers.

Insulating layer 59 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of hafnium oxide ($HfO_2$), or of diamond. As an example, the thickness of insulating layer 59 is in the range from 5 nm to 100 nm, for example, equal to approximately 30 nm. Insulating layer 59 may have a monolayer structure or may correspond to a stack of two layers or of more than two layers.

Semiconductor elements 20 are at least partly made of at least one semiconductor material. The semiconductor material may be silicon, germanium, silicon carbide, a III-V compound, a II-VI compound, or a combination of at least two of these compounds.

Semiconductor elements 20 may be at least partly made of semiconductor materials mainly comprising a III-V compound, for example, a III-N compound. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions.

Semiconductor elements 20 may be at least partly formed based on semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

Semiconductor elements 20 may comprise a dopant, particularly in lower portion 56. As an example, for III-V compounds, the dopant may be selected from the group comprising a group-II P-type dopant, for example, magnesium (Mg), zinc (Zn), cadmium (Cd), or mercury (Hg), a group-IV P-type dopant, for example, carbon (C), or a group-IV N-type dopant, for example, silicon (Si), germanium (Ge), selenium (Se), sulfur (S), terbium (Tb), or tin (Sn).

When semiconductor elements 20 correspond to wires, the height of upper portion 58, outside of opening 52, may be in the range from 250 nm to 50 μm. Each wire 20 may have an elongated semiconductor structure along an axis substantially perpendicular to surface 12. Each wire 20 may have a generally cylindrical shape, particularly with a circular or hexagonal base. The axes of two adjacent wires 20 may be distant by from 0.5 μm to 10 μm and preferably from 1.5 μm to 5 μm. As an example, wires 20 may be regularly distributed, particularly according to a hexagonal network.

The height of each pyramid 62, 66 may be in the range from 100 nm to 25 μm. Each pyramid may have a semiconductor structure elongated along an axis substantially perpendicular to surface 12. The base of each pyramid 62, 66 may have a general shape of oval, circular, or polygonal type, particularly triangular, rectangular, square, or hexagonal. The centers of two adjacent pyramids may be distant by from 0.25 μm to 10 μm and preferably from 1.5 μm to 5 μm. As an example, the pyramids may be regularly distributed, particularly in a hexagonal network.

Shell 28 may comprise a stack of a plurality of layers especially comprising:
  an active layer covering upper portion 58 or the associated pyramid 62, 66;
  an intermediate layer having a conductivity type opposite to that of lower portion 56 and covering the active layer; and
  a bonding layer covering the intermediate layer and covered with electrode 30.

The active layer is the layer from which most of the radiation delivered by light-emitting diode DEL is emitted. According to an example, the active layer may comprise confinement means, such as multiple quantum wells. It is for example formed of an alternation of GaN and InGaN layers having respective thicknesses from 3 to 20 nm (for example, 6 nm) and from 1 to 10 nm (for example, 2.5 nm). The GaN layers may be doped, for example, of type N or P. According to another example, the active layer may comprise a single InGaN layer, for example having a thickness greater than 10 nm.

The intermediate layer, for example, P-type doped, may correspond to a semiconductor layer or to a stack of semiconductor layers and enables to form a P-N or P-I-N junction, the active layer being located between the intermediate P-type layer and the upper N-type portion of wire 20 of the P-N or P-I-N junction.

The bonding layer may correspond to a semiconductor layer or to a stack of semiconductor layers and enables to form an ohmic contact between the intermediate layer and electrode 30. As an example, the bonding layer may be very heavily doped, of a type opposite to that of lower portion 56, until degeneration of the semiconductor layer(s), for example, P-type doped at a concentration greater than or equal to $10^{20}$ atoms/cm$^3$.

The stack of semiconductor layers may comprise an electron barrier layer formed of a ternary alloy, for example, aluminum gallium nitride (AlGaN) or aluminum indium nitride (AlInN) in contact with the active layer and the intermediate layer, to provide a good distribution of electric carriers in the active layer.

Electrode 30 is capable of biasing the active layer covering each semiconductor wire 20 and of letting through the electromagnetic radiation emitted by light-emitting diodes DEL. The material forming electrode 30 may be a transparent and conductive material such as indium tin oxide (ITO), zinc oxide, doped or not with aluminum or gallium, or graphene. As an example, electrode layer 30 has a thickness in the range from 5 nm to 200 nm, preferably from 20 nm to 50 nm.

Encapsulation layer 34 is made of an at least partially transparent insulating material. The maximum thickness of encapsulation layer 34 is in the range from 250 nm to 50 µm so that encapsulation layer 34 totally covers electrode 30 at the top of light-emitting diodes DEL.

As a variation, a mirror conductive layer, not shown, covering electrode layer 30 between upper portions 58 or between pyramids 62, 66 without however extending on semiconductor elements 20, may be provided. The mirror conductive layer may correspond to a metal layer, for example, made of aluminum, of silver, of copper, or of zinc.

According to another variation, optoelectronic device 50 may further comprise a phosphor layer, not shown, provided on encapsulation layer 34 or confounded therewith.

First steps of an embodiment of a method of manufacturing optoelectronic device 50 shown in FIG. 3 will be described in relation with FIGS. 6A to 6H.

Figure 6A:
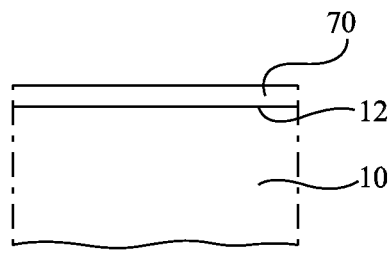
FIGS. 6A to 6H, 7A and 7B, 8A to 8H, and 9A to 9C are partial simplified cross-section views of structures obtained at initial successive steps of embodiments of a method of manufacturing the optoelectronic device shown in FIG. 3.

FIG. 6A shows the structure obtained after the forming of a resin layer 70 on surface 12 of substrate 10.

Figure 6B:
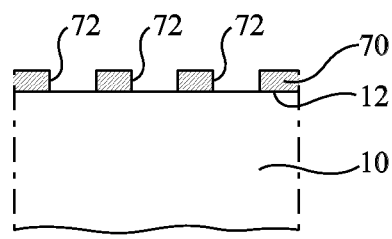

FIG. 6B shows the structure obtained after the forming of openings 72 in resin layer 70 to expose portions of surface 12 of substrate 10, three openings 72 being shown as an example in FIG. 6B. Openings 72 may be formed by lithography steps, particularly by photolithography, nanoimprinting lithography, electron beam lithography, or direct writing.

Figure 6C:
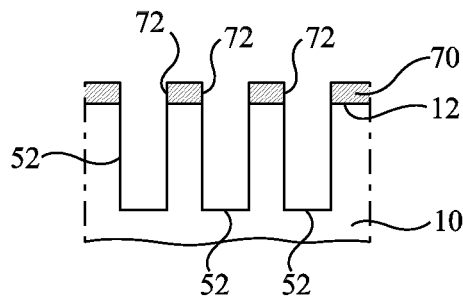

FIG. 6C illustrates the structure obtained after the etching of openings 52 as an extension of openings 72. Openings 52 may be etched by means of an anisotropic etching, for example, a reactive ion etching or RIE or an inductively coupled plasma or ICP etching.

Figure 6D:
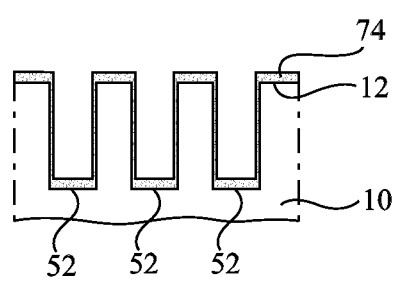

FIG. 6D shows the structure obtained after having removed resin layer 70 and after having deposited a layer 74 of the material forming the seed pads, called seed layer 74 hereafter, over the entire structure and particularly on the lateral walls and on the bottom of each opening 52. Advantageously, a large number of deposition methods may be implemented. Indeed, the method of depositing layer 74 may be a deposition method, conformal, directional or intermediate between a conformal deposition method and a directional deposition method. In the case of a directional deposition, layer 74 may be non-continuous.

Seed layer 74 may be deposited by a method of chemical vapor deposition (CVD) type or metal-organic chemical vapor deposition (MOCVD) type, also known as metal-organic vapor phase epitaxy (MOVPE). However, methods such as molecular beam epitaxy (MBE), gas-source MBE (GSMBE), metal-organic MBE (MOMBE), plasma-assisted MBE (PAMBE), atomic layer epitaxy (ALE), hydride vapor phase epitaxy (HVPE), or an atomic layer deposition (ALD), may be used. Further, physical vapor deposition (PVD) methods, such as evaporation or cathode sputtering, may be used.

The thickness of seed layer 74 at the bottom of each opening 52 is in the range from 1 to 100 nanometers, preferably in the range from 10 to 30 nanometers.

When seed layer 74 is made of aluminum nitride, it may be substantially textured and have a preferred polarity. The texturing of layer 74 may be obtained by an additional treatment performed after the deposition of the seed layer. It for example is an anneal under an ammonia flow ($NH_3$).

Figure 6E:
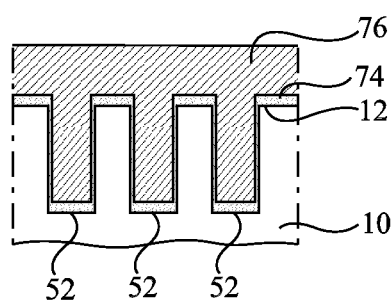

FIG. 6E shows the structure obtained after having deposited a resin layer 76 over the entire structure. The resin is selected to substantially totally fill each opening 52, and may be positive or negative.

Figure 6F:
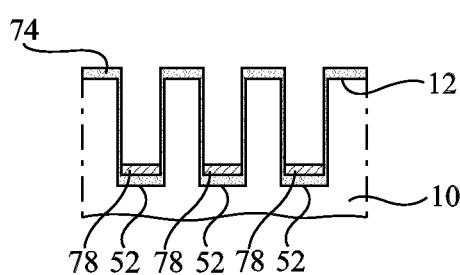

FIG. 6F shows the structure obtained after having etched a portion of resin layer 76 to expose a portion of seed layer 74 and to leave a resin portion 78 in each opening 52. The etching is, for example, a plasma etching using an oxygen plasma but may also comprise, in the case of a positive resin, a partial exposure and development of the resin (adjustment of the exposure energy) or a combination of the two exposure/development methods and of an oxygen plasma etching or, in the case of a negative resin, a partial development of the resin (adjustment of the development time) or a combination of the two methods, development and oxygen plasma etching.

Preferably, the thickness of each resin portion 78 is at least equal to the thickness of seed layer 74 at the bottom of each opening 52. Preferably, the thickness of each resin portion 78 is in the range from 1 to 100 nanometers, preferably in the range from 10 to 30 nanometers.

Figure 6G:
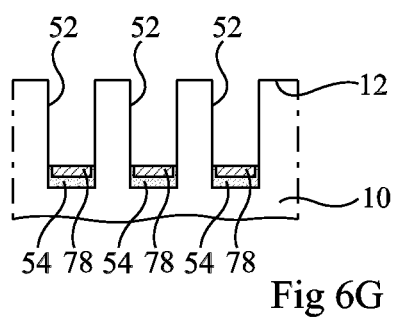

FIG. 6G shows the structure obtained after a step of etching the exposed portions of the seed layer to leave the portions of the seed layer which were covered with resin portion 78 and which correspond to seed pads 54. The etching is an anisotropic etching, for example, a plasma etching or a chemical etching. Preferably, the etching is selective over the material forming the resin. Each seed pad 54 covers the bottom of the associated opening 52 and may further cover a portion of the lateral walls of opening 52 up to a height smaller than or equal to the thickness of resin layer 78. The fact for the thickness of resin portions 78 to be substantially equal to the thickness of seed layer 74 at the bottom of openings 72 enables to avoid an etching of seed layer 74 at the bottom of openings 72 in the case where the etching is not selective or not sufficiently selective over resin portions 78.

Figure 6H:
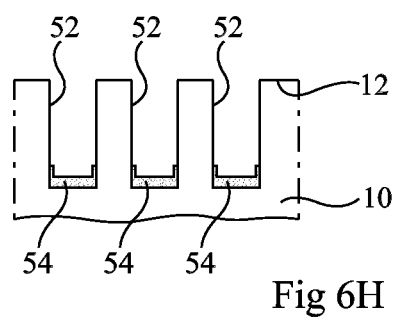

FIG. 6H shows the structure obtained after the removal of resin portions 78 to expose seed pads 54. The removal of resin portions 78 may be performed by the dipping of the structure shown in FIG. 6G into a bath containing a solvent capable of dissolving resin portions 78.

First steps of another embodiment of a method of manufacturing optoelectronic device 50 shown in FIG. 3 will be described in relation with FIGS. 7A and 7B. This embodiment comprises the steps previously described in relation with FIGS. 6A to 6C.

Figure 7A:
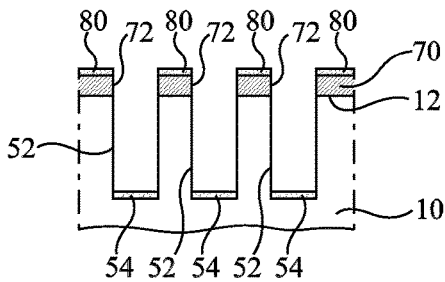

FIG. 7A shows the structure obtained after the forming of seed pads 54 at the bottom of openings 52 and the forming of portions 80 of the material forming the seed pads on the upper surface of resin layer 70. According to an embodiment, the method of forming pads 54 and portions 80 is a directional method so that there is no deposition of the material forming the seed pads on the lateral walls of openings 52. According to an embodiment, the deposition method is a collimated sputtering or evaporation deposition method. However, in this case, ratio F of height H to diameter L is preferably smaller than 1 to obtain a proper deposit at the bottom of openings 52.

Figure 7B:
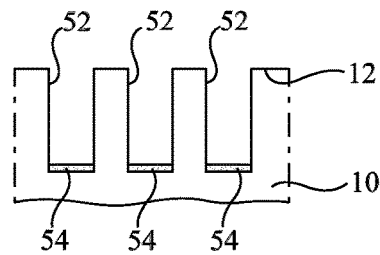

FIG. 7B shows the structure obtained after the removal of resin layer 70, which also causes the removal of portions 80. The removal of the resin layer may be performed by dipping the structure shown in FIG. 7A into a bath containing a solvent capable of dissolving resin layer 70.

First steps of another embodiment of a method of manufacturing optoelectronic device 50 shown in FIG. 3 will be described in relation with FIGS. 8A to 8H.

Figure 8A:
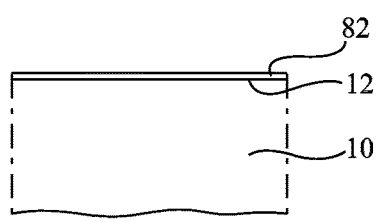

FIG. 8A shows the structure obtained after the forming of an insulating layer 82 on surface 12 of substrate 10. Insulating layer 82 may be a silicon oxide layer. Insulating layer 82 may be for example deposited according to a conformal deposition, particularly by CVD. As a variation, insulating layer 82 may be obtained by thermal oxidation of substrate 10. The thickness of insulating layer 82 may be in the range from 5 nm to 100 nm.

Figure 8B:
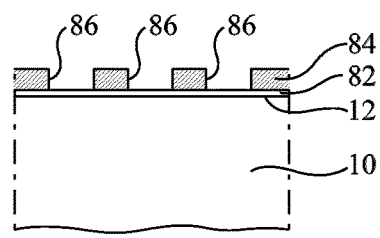

FIG. 8B shows the structure obtained after the forming of a resin layer 84 on surface 12 of substrate 10 and the forming of openings 86 in resin layer 84 to expose portions of insulating layer 82, three openings 86 being shown as an example in FIG. 8B.

Resin layer 84 may have the same composition and the same thickness as previously-described resin layer 70. Openings 86 may be formed by photolithography steps.

Figure 8C:
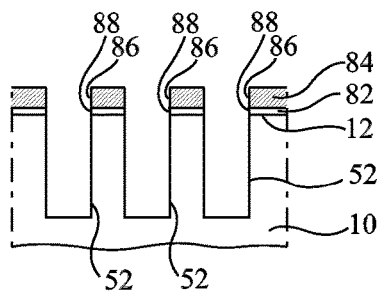

FIG. 8C shows the structure obtained after the etching of openings 88 in insulating layer 82, as an extension of openings 72, and the etching of openings 52 as an extension of openings 88.

Figure 8D:
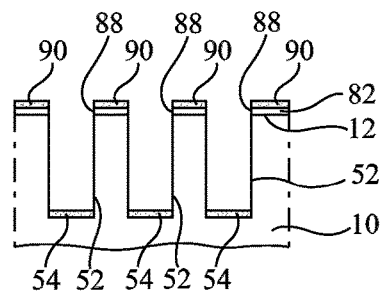

FIG. 8D shows the structure obtained after the removal of resin layer 84, followed by the forming of seed pads 54 at the bottom of openings 52 and the forming of portions 90 of the material forming the seed pads on the upper surface of insulating layer 82. According to an embodiment, the method of forming pads 54 and portions 90 is a directional method so that there is no deposition of the material forming the seed pads on the lateral walls of openings 52. According to an embodiment, the deposition method is a collimated sputtering or evaporation deposition method. However, in this case, ratio F of height H to diameter L is preferably smaller than 1 to obtain a proper deposit at the bottom of openings 52.

Figure 8E:
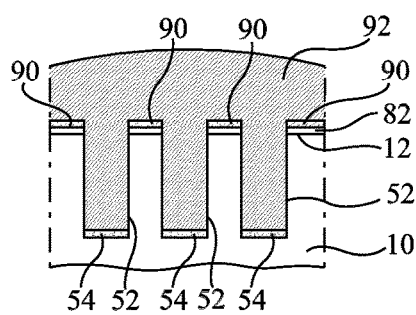

FIG. 8E shows the structure obtained after the deposition of a resin layer 92 over the entire structure, so that resin layer 92 substantially totally fills each opening 52.

Figure 8F:
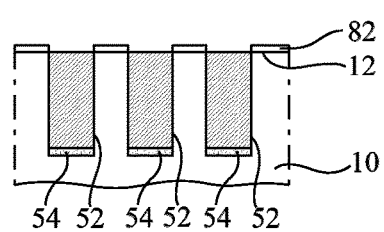

FIG. 8F shows the structure obtained after the removal of a portion of resin layer 92 and the removal of portions 90 to expose insulating layer 82. The etching of resin layer 92 for example implements a chemical-mechanical planarization or CMP method. Insulating layer 80 then plays the role of an etch stop layer for the CMP. Portions 92 of resin layer 70 are left in openings 52.

Figure 8G:
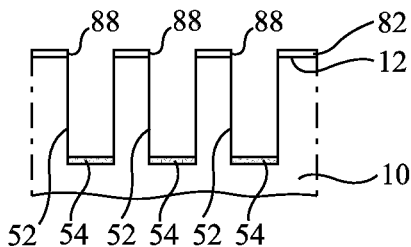

FIG. 8G shows the structure obtained after the removal of the rest of portions 92 of the resin layer to expose seed pads 54. The removal of portions 92 of the resin layer may be performed by the dipping of the structure shown in FIG. 8F into a bath containing a solvent capable of dissolving the resin.

Figure 8H:
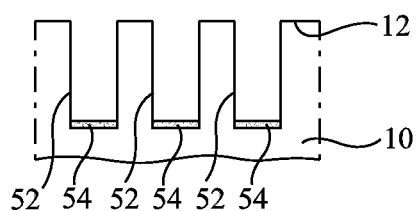

FIG. 8H shows the structure obtained after the etching of insulating layer 82. This step may be omitted.

First steps of another embodiment of a method of manufacturing optoelectronic device 50 shown in FIG. 3 will be described in relation with FIGS. 9A to 9C. This embodiment comprises the steps previously described in relation with FIGS. 8A to 8C.

Figure 9A:
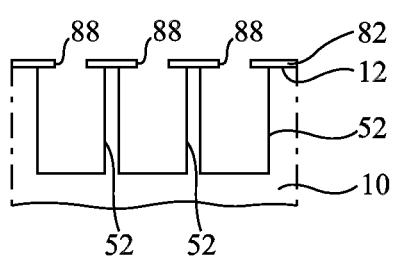

FIG. 9A shows the structure obtained after the removal of resin layer 84 and the etching of substrate 10 to enlarge the diameter of openings 52. The etching of substrate 10 may be an anisotropic wet chemical etching using an aqueous solution of potassium hydroxide (KOH) or of tetramethylammonium hydroxide (TMAH). The etching of substrate 10 is an etching selective over the material forming insulating layer 82 so that, at the end of the etch step, the diameter of each opening 52 is greater than the diameter of the associated opening 88.

Figure 9B:
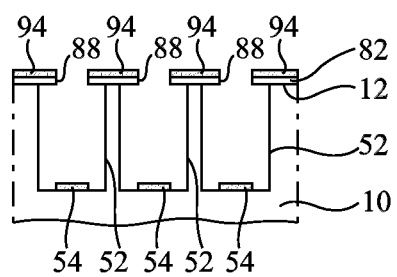

FIG. 9B shows the structure obtained after the forming of seed pads 54 at the bottom of openings 52 and the forming of portions 94 of the material forming the seed pads on the upper surface of insulating layer 82. According to an embodiment, the method of forming pads 54 and portions 94 is a directional deposition method. According to an embodiment, the deposition method is a collimated sputtering or evaporation deposition method. However, in this case, the ratio of height H of opening 52 to the diameter of openings 88 is preferably smaller than 1 to obtain a proper deposit at the bottom of openings 52. According to another embodiment, the method of forming pads 54 and portions 94 is a deposition method intermediate between a directional deposition and a conformal deposition. In this case, the shading of the lateral walls of each opening 52 by insulating layer 82 due to the difference between the diameter of opening 88 and the diameter of opening 52 is sufficiently large to prevent the deposition of the material forming the seed pads on the lateral walls.

Figure 9C:
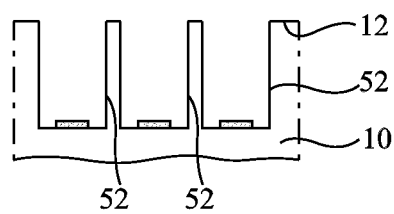

FIG. 9C shows the structure obtained after the removal of insulating layer 82, which also causes the removal of portion 94. The removal of insulating layer 82 may be performed by using a BOE-type (Buffered Oxide Etch) solution.

Subsequent steps of an embodiment of a method of manufacturing optoelectronic device 50 shown in FIG. 3 will now be described in relation with FIGS. 10A to 10C.

Figure 10A:
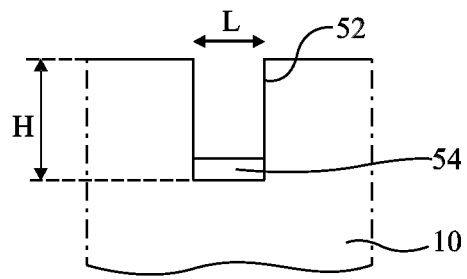
FIGS. 10A to 10C are partial simplified cross-section views of structures obtained at subsequent successive steps of another embodiment of a method of manufacturing the optoelectronic device shown in FIG. 3.

FIG. 10A illustrates the structure obtained after the forming of openings 52 and of seed pads 54 at the bottom of each opening 52. Any of the embodiments previously-described in relation with FIGS. 6A to 6H, 7A and 7B, 8A to 8H, and 9A to 9C may be implemented to obtain the structure shown in FIG. 10A. In the case where the embodiment previously described in relation with FIGS. 6A to 6H is implemented, each seed pad 54 may further extend on a portion of the lateral walls of opening 52. In the case where the embodiment previously described in relation with FIGS. 9A to 9C is implemented, it is possible for each seed pad 54 not to extend on the entire bottom of the associated opening 52.

Figure 10B:
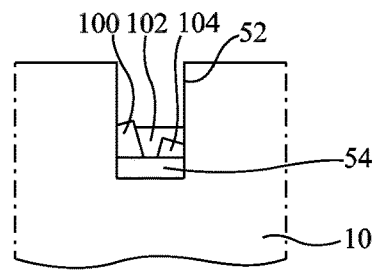

FIG. 10B illustrates the structure obtained after the step of:

(1) Forming seeds in each opening 52, three seeds 100, 102, 104 being shown as an example in FIG. 10B.

The method of forming seeds 100, 102, 104 may be a method of CVD, MOCVD, MBE, GSMBE, PAMBE, ALE, HVPE, ALD type. Further, electrochemical methods may be used, for example, chemical bath deposition (CBD), hydrothermal methods, liquid-feed flame spray pyrolysis, or electrodeposition.

As an example, the seed-forming method may comprise injecting into a reactor a precursor of a group-III element and a precursor of a group-V element. Examples of group-III precursors are trimethylgallium (TMGa), triethylgallium (TEGa), trimethylindium (TMIn), or trimethylaluminum (TMAl). Examples of precursors of group-V elements are ammonia ($NH_3$), tertiarybutylphosphine (TBP), arsine ($AsH_3$), or unsymmetrical dimethylhydrazine (UDMH).

Figure 10C:
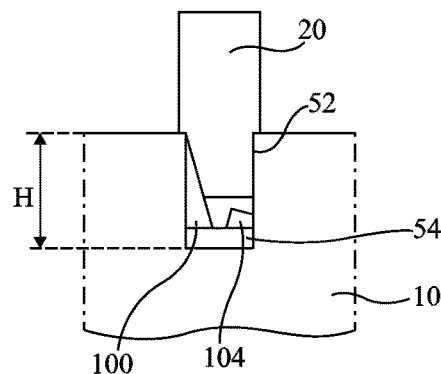

This step may result in the forming of passivation layer 59, not shown in FIGS. 10A to 10C.

According to an embodiment, the temperature in the reactor at step (1) is lower than or equal to 1,000° C., preferably lower than or equal to 820° C.

According to an embodiment, the ratio of the flow rate of the group-V element precursor gas to the flow rate of the group-III element precursor gas, or V/III ratio, at step (1) is greater than or equal to 1,000, preferably greater than or equal to 5,000.

FIG. 10C shows the structure obtained after the step of:

(2) Growing a wire-shaped semiconductor element 20 in each opening 52.

The method of growing wires 20 may be a method of CVD, MOCVD, MBE, GSMBE, PAMBE, ALE, HVPE, ALD type. Further, electrochemical methods may be used, for example, chemical bath deposition (CBD), hydrothermal methods, liquid-feed flame spray pyrolysis, or electrodeposition.

As appears in FIG. 10C, the fact of having a sufficiently large height H of opening 52 results in that only the wire having a growth axis substantially parallel to the axis of opening 52 succeeds in growing outside of opening 52.

As compared with a manufacturing method where wires 20 are formed in openings of an insulating layer covering the substrate, an advantage of the previously-described embodiments where wires 20 grow from openings 52 is that the stress in substrate 10 due to expansion differences between the insulating layer and the substrate during the forming of wires 20 are decreased.

The subsequent steps of the method of manufacturing optoelectronic device 50 are the following:

(3) Forming by epitaxy, for each wire 20, the layers which form shell 28. The deposition of the layers forming shell 28 only occurs on the portion of wire 20 outside of opening 52.

(4) Forming second electrode 30, for example, by conformal deposition.

(5) Forming encapsulation layer 34. When encapsulation layer 34 is made of silicone, encapsulation layer 34 may be deposited by spin coating, by jet printing, or by a silk-screening method. When encapsulation layer 34 is an oxide, it may be deposited by CVD.

(6) Forming by deposition first electrode 8, covering lower surface 11 of substrate 10.

(7) Sawing substrate 10 to separate the optoelectronic devices.

As an example, above-described step (6) may be carried out between above-described step (4) and step (5) or between above-described step (3) and step (4).

An embodiment of a method of manufacturing optoelectronic devices 60 or 65, respectively shown in FIG. 4 or 5, comprises above-described steps (1) to (7), with the difference that step (2) is replaced with step (8) of:

(8) Growing lower portion 56 of each semiconductor element 20 in each opening 52 and growing pyramids 62, 66 outside of each opening 52. The method of growing pyramids 62, 66 may be a method of CVD, MOCVD, MBE, GSMBE, PAMBE, ALE, HVPE, ALD type. Further, electrochemical methods may be used, for example, the CBD method, hydrothermal methods, liquid-feed flame spray pyrolysis, or electrodeposition. The growth conditions are selected to grow the crystal structures preferably in the form of pyramids rather than in the form of wires.

Figure 11:
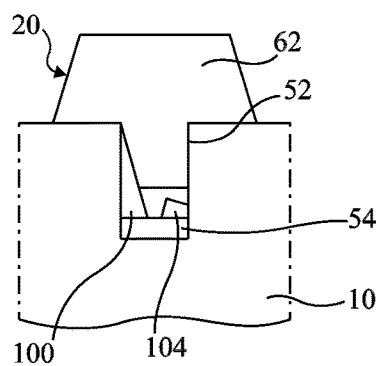
FIG. 11 is a partial simplified cross-section view of the structure obtained at a step of an embodiment of a method of manufacturing the optoelectronic device shown in FIG. 5.

FIG. 11 shows the structure obtained at step (8) during the growth of pyramid 62.

In the previously-described embodiments, openings 52 have a substantially constant diameter along their entire height.

According to another embodiment, it is possible for the diameter of each opening 52 not to be constant along the entire height of the opening.

Figure 12:
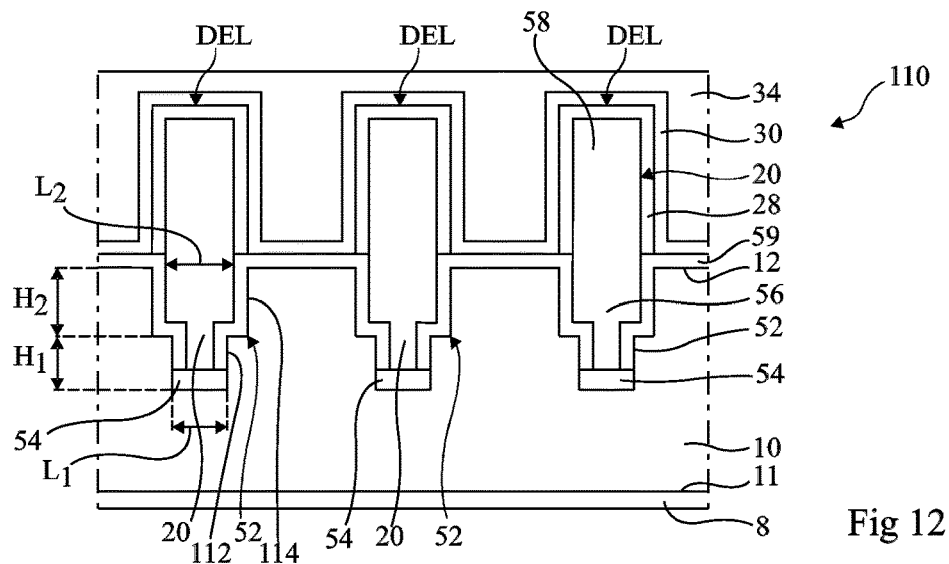
FIG. 12 is a partial simplified cross-section view of an embodiment of an optoelectronic device comprising microwires or nanowires.

FIG. 12 is a partial simplified cross-section view of another embodiment of an optoelectronic device 110 comprising light-emitting diodes. Optoelectronic device 110 comprises the same elements as optoelectronic device 50 shown in FIG. 3, except that opening 52 comprises first and second successive opening portions 112, 114 having different diameters, the first opening portion 112 being the closest to the bottom of the opening. First opening portion 112 may have a height $H_1$ and a diameter $L_1$, preferably substantially constant all along height $H_1$. Second opening portion 114 may have a height $H_2$ and a diameter $L_2$, preferably substantially constant all along height $H_2$.

According to an embodiment, diameter $L_1$ is smaller than diameter $L_2$. As an example, height $H_1$ is in the range from 30 nm to 500 nm, preferably from 100 nm to 300 nm. As an example, diameter $L_1$ is in the range from 30 nm to 1 µm, preferably from 100 nm to 600 nm. Ratio $F_1$ of height $H_1$ to diameter $L_1$ is in the range from 0.1 to 4, preferably from 0.75 to 1.5. As an example, height $H_2$ is in the range from 200 nm to 2,000 nm, preferably from 250 nm to 500 nm. As an example, diameter $L_2$ is in the range from 50 nm to 2 µm, preferably from 150 nm to 800 nm. Ratio $F_2$ of height $H_2$ to diameter $L_2$ is in the range from 0.1 to 4, preferably from 0.75 to 1.5. Diameter $L_1$ is selected to favor the growth of a single seed in opening 52. Diameter $L_2$ is selected according to the desired diameter of the wire.

Advantageously, the dimensions of the first opening portion are a parameter of control of the seed forming and the dimensions of second opening portion are a control parameter of the selection of a single wire. Thereby, the control parameters of the seed forming and of the selection of a single wire do not depend on a single opening and may be adjusted independently.

In the previously-described embodiments, shell 28 covers each wire 20 all the way to insulating layer 59. However, as a variation, an insulating layer covering a portion of the lateral sides of each wire 20 along part of the height of wires 20 outside of openings 52 may be provided. Shell 28 then covers the lateral sides of wires 20 except at the locations where the insulating layer is present. The insulating layer may further cover part of shell 28.

Specific embodiments of the present invention have been described. Although embodiments have been described for an optoelectronic device for which shell 28 covers the top of the associated wire 20 and part of the lateral sides of wire 20 have been described, it is possible to only provide the shell at the top of wire 20.

The invention claimed is:

1. An optoelectronic device comprising:
   a monoblock substrate comprising a surface, non-through openings extending into the substrate from the surface;
   a pad at the bottom of each opening;
   for each pad, a single semiconductor element resting on said pad, extending partly in the opening containing said pad and partly outside of the opening, the pads being made of a material favoring the growth of the semiconductor elements, the height of each opening being greater than or equal to 25 nm and smaller than or equal to 5 µm and the ratio of the height to the smallest diameter of each opening being greater than or equal to 0.5 and smaller than or equal to 15, the semiconductor elements being nanowires, microwires, and/or nanometer- or micrometer-range pyramidal structures; and
   for each semiconductor element, a shell comprising at least one active layer partly covering the semiconductor element, and capable of emitting or of absorbing a radiation.

2. The optoelectronic device of claim 1, wherein the height is greater than or equal to 100 nm.

3. The optoelectronic device of claim 1, wherein the height is greater than or equal to 500 nm.

4. The optoelectronic device of claim 1, wherein the average diameter of each opening is constant along the entire height of the opening.

5. The optoelectronic device of claim 1, comprising, at the bottom of each opening, a pad made of at least a first material selected from the group comprising aluminum nitride, boron, boron nitride, titanium, titanium nitride, tantalum, tantalum nitride, hafnium, hafnium nitride, niobium, niobium nitride, zirconium, zirconium borate, zirconium nitride, silicon carbide, tantalum carbide nitride, magnesium nitride in $Mg_xN_y$ form, where x is approximately equal to 3 and y is approximately equal to 2, or gallium nitride.

6. The optoelectronic device of claim 1, wherein each semiconductor element is mainly made of a III-V compound, particularly gallium nitride, or a II-VI compound.

7. The optoelectronic device of claim 1, wherein the substrate is made of a second material from the group comprising a semiconductor material, particularly silicon, germanium, silicon carbide, a III-V compound such as GaN or GaAs, or ZnO.

\* \* \* \* \*